US012628965B2

(12) United States Patent
Koike

(10) Patent No.: US 12,628,965 B2
(45) Date of Patent: May 19, 2026

(54) SEATING DETECTION DEVICE AND SEATING MONITORING SYSTEM

(71) Applicant: Toshiba Tec Kabushiki Kaisha, Shinagawa-ku (JP)

(72) Inventor: Sho Koike, Sunto Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 322 days.

(21) Appl. No.: 18/453,434

(22) Filed: Aug. 22, 2023

(65) Prior Publication Data

US 2024/0090679 A1 Mar. 21, 2024

(30) Foreign Application Priority Data

Sep. 16, 2022 (JP) ................................. 2022-148452

(51) Int. Cl.
*A47C 31/12* (2006.01)
*H03K 17/955* (2006.01)
(52) U.S. Cl.
CPC ......... *A47C 31/126* (2013.01); *H03K 17/955* (2013.01); *H03K 2217/0081* (2013.01)
(58) Field of Classification Search
CPC ...... A47C 31/126; A47C 1/13; H03K 17/955; H03K 2217/0081
USPC ........................................... 297/217.2, 217.3
See application file for complete search history.

(56) References Cited

U.S. PATENT DOCUMENTS 3,764,861 A * 10/1973 Orris .................... H03K 17/955
331/113 R
4,678,058 A 7/1987 Wooters 6,056,079 A * 5/2000 Cech ................. B60R 21/01516
177/144
6,079,738 A * 6/2000 Lotito ............... B60R 21/01554
280/734
6,831,565 B2 * 12/2004 Wanami ............ B60R 21/01532
297/250.1
7,598,881 B2 * 10/2009 Morgan ............ B60R 21/01534
340/552

(Continued)

FOREIGN PATENT DOCUMENTS

JP        2003-504624 A      2/2003
JP        2007-225443 A      9/2007
JP        2020-032870 A      3/2020

OTHER PUBLICATIONS

Notice of Reasons for Refusal dated Jul. 1, 2025 issued in JP Application No. 2022-148452, with English translation, 8 pages.

*Primary Examiner* — Jose V Chen
(74) *Attorney, Agent, or Firm* — FOLEY & LARDNER LLP

(57) ABSTRACT

A seating detection device includes a sensor, a coupler, a power supply, a switch, and a controller. The sensor forms an electric field to detect a change in an electrostatic capacitance. The coupler couples the sensor to a chair. The power supply supplies power for forming the electric field to the sensor. The switch controls transmission of power from the power supply to the sensor. After the switch is turned on, the controller sets a seating threshold based on the change in electrostatic capacitance detected by the sensor. The seating threshold represents a threshold amount of electrostatic capacitance. The controller determines whether an occupant is seated on the chair based on the seating threshold.

17 Claims, 4 Drawing Sheets

(56)                    References Cited

U.S. PATENT DOCUMENTS

|  |  |  |  |
|---|---|---|---|
| 7,916,035 B2 | 3/2011 | Hansen | |
| 11,763,210 B2 * | 9/2023 | Bidewell | A47C 7/723 |
| | | | 297/217.2 |
| 2003/0151239 A1 | 8/2003 | Murphy | |
| 2009/0058661 A1 * | 3/2009 | Gleckler | A47C 31/126 |
| | | | 340/573.7 |
| 2012/0116251 A1 | 5/2012 | Ben-Shalom et al. | |
| 2012/0277637 A1 * | 11/2012 | Vahdatpour | A47C 31/123 |
| | | | 600/595 |
| 2013/0161110 A1 * | 6/2013 | Furst | G01G 19/08 |
| | | | 297/217.2 |
| 2015/0168206 A1 | 6/2015 | Ruby | |
| 2015/0168469 A1 * | 6/2015 | Farr | B60N 2/5685 |
| | | | 702/65 |
| 2015/0210192 A1 * | 7/2015 | Benson | B60N 2/505 |
| | | | 297/217.2 |
| 2015/0320352 A1 | 11/2015 | Ben Shalom et al. | |
| 2015/0327687 A1 * | 11/2015 | Chacon | G01V 3/088 |
| | | | 700/275 |
| 2015/0360643 A1 * | 12/2015 | Cech | B60R 21/01546 |
| | | | 297/217.3 |
| 2016/0183687 A1 * | 6/2016 | Hoyt | A47C 7/56 |
| | | | 297/217.2 |
| 2016/0200220 A1 * | 7/2016 | Sugiyama | A61B 5/0245 |
| | | | 297/217.2 |
| 2019/0031130 A1 * | 1/2019 | Lamesch | H03K 17/955 |
| 2019/0047502 A1 * | 2/2019 | Lamesch | B60N 2/0035 |
| 2020/0200936 A1 * | 6/2020 | Kruger | G01V 3/088 |
| 2023/0046256 A1 * | 2/2023 | Lamesch | B60N 2/0021 |
| 2023/0219515 A1 * | 7/2023 | Althaus | B60N 2/0034 |
| | | | 307/10.1 |

* cited by examiner

FIG. 4

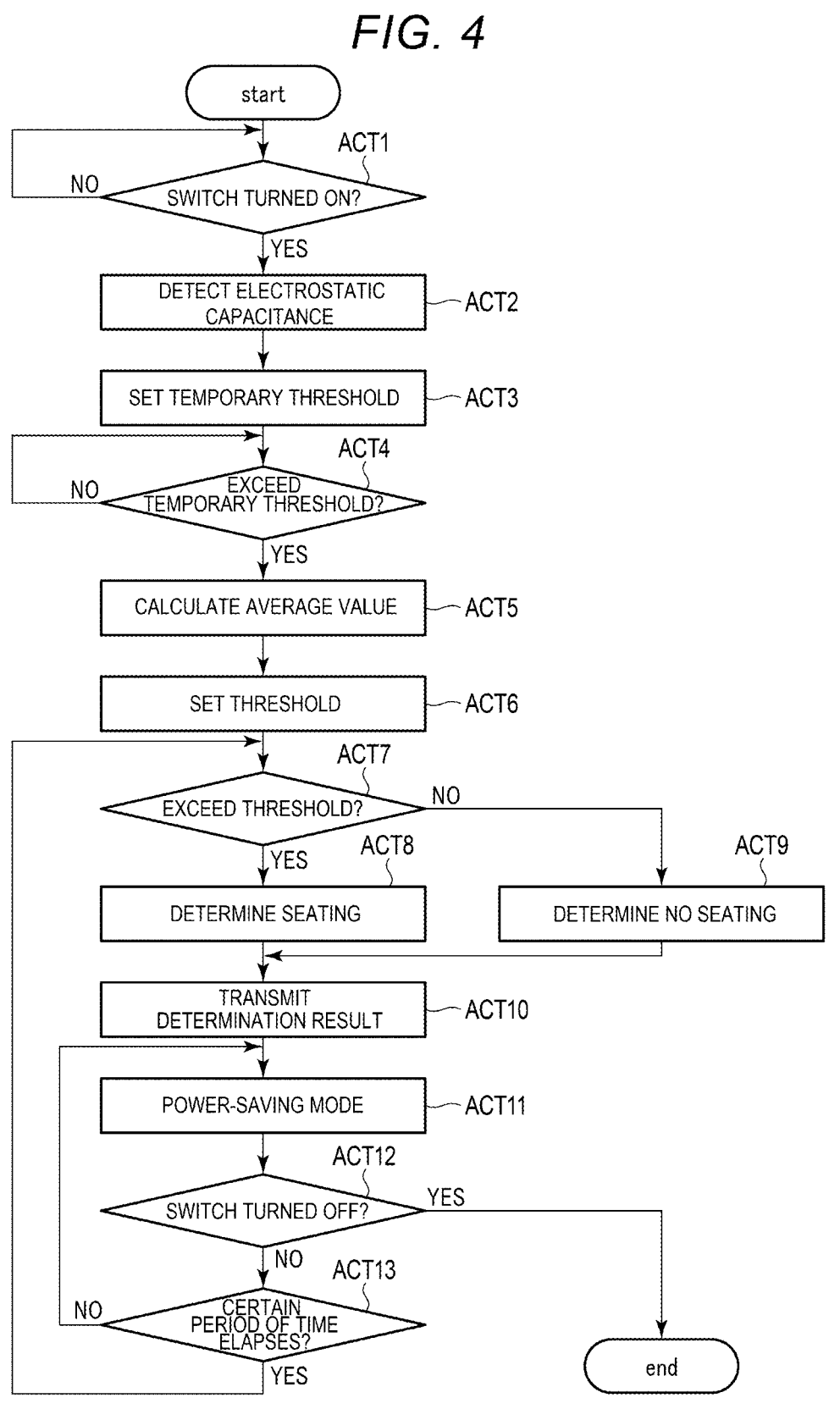

```
                          ┌─────────┐
                          │  start  │
                          └─────────┘
                               │
                               ▼                    ACT1
         ┌─NO────◇ SWITCH TURNED ON? ◇
         │                    │
         │                  YES│
         │                     ▼
         │      ┌──────────────────────────┐
         │      │ DETECT ELECTROSTATIC      │── ACT2
         │      │ CAPACITANCE               │
         │      └──────────────────────────┘
         │                     │
         │                     ▼
         │      ┌──────────────────────────┐
         │      │ SET TEMPORARY THRESHOLD   │── ACT3
         │      └──────────────────────────┘
         │                     │          ACT4
         │─NO────◇ EXCEED TEMPORARY THRESHOLD? ◇
         │                     │
         │                  YES│
         │                     ▼
         │      ┌──────────────────────────┐
         │      │ CALCULATE AVERAGE VALUE   │── ACT5
         │      └──────────────────────────┘
         │                     │
         │                     ▼
         │      ┌──────────────────────────┐
         │      │ SET THRESHOLD             │── ACT6
         │      └──────────────────────────┘
         │                     │          ACT7
         │        ◇ EXCEED THRESHOLD? ◇────NO──────┐
         │                     │                   │
         │                  YES│     ACT8           │    ACT9
         │      ┌──────────────────────┐  ┌──────────────────────┐
         │      │ DETERMINE SEATING    │  │ DETERMINE NO SEATING │
         │      └──────────────────────┘  └──────────────────────┘
         │                     │◄─────────────────┘
         │                     ▼
         │      ┌──────────────────────────┐
         │      │ TRANSMIT                  │── ACT10
         │      │ DETERMINATION RESULT      │
         │      └──────────────────────────┘
         │                     │
         │                     ▼
         │      ┌──────────────────────────┐
         │      │ POWER-SAVING MODE         │── ACT11
         │      └──────────────────────────┘
         │                     │          ACT12
         │        ◇ SWITCH TURNED OFF? ◇────YES─────┐
         │                     │                    │
         │                   NO│   ACT13            │
         │─NO────◇ CERTAIN PERIOD OF TIME ELAPSES? ◇ │
                               │                    ▼
                            YES│              ┌─────────┐
                                              │   end   │
                                              └─────────┘
```

SEATING DETECTION DEVICE AND SEATING MONITORING SYSTEM

CROSS-REFERENCE TO RELATED APPLICATION

This application is based upon and claims the benefit of priority from Japanese Patent Application No. 2022-148452, filed on Sep. 16, 2022, the entire contents of which are incorporated herein by reference.

FIELD

An embodiment described herein relates to a seating detection device and a seating monitoring system that detect that a person sits on a chair.

BACKGROUND

In the related art, there is a seating sensor attached to a back surface of a seat cushion of a vehicle as a device that detects that a person sits on a chair. In this way, cushioning properties of the seat cushion are not impaired by attaching the seating sensor to the back surface of the seat cushion.

The related-art seating sensor described above brings two contact points into contact with each other due to deformation of the seat cushion when a person is seated, and outputs a signal of the contact. Therefore, it is necessary to optimize a gap between the two contact points or the like by making the seating sensor match a material, ease of the deformation, and the like of the seat cushion to which the seating sensor is attached. In other words, this type of seating sensor needs to match characteristics of the chair to be attached to so as to optimize detection sensitivity, and does not have versatility such that the seating sensor is used by being attached to an existing chair.

DESCRIPTION OF THE DRAWINGS

FIG. 4 is a flowchart illustrating a use example of the seating detection device;

DETAILED DESCRIPTION

In general, according to one embodiment, a seating detection device and a seating monitoring system that can be used by being attached to an existing chair are provided.

A seating detection device according to an embodiment includes a sensor, a coupler, a power supply, a switch, and a controller. The sensor forms an electric field to detect a change in electrostatic capacitance. The coupler couples the sensor to a chair. The power supply supplies power for forming the electric field to the sensor. The switch controls transmission of the power from the power supply to the detection unit. After the switch is turned on, the controller sets a seating threshold based on the change in electrostatic capacitance detected by the sensor. The seating threshold represents a threshold amount of electrostatic capacitance. The controller determines whether an occupant is seated on the chair based on the seating threshold.

A seating monitoring system according to an embodiment includes the seating detection device described above; and a monitoring device configured to receive and display a determination result of the determination unit.

Figure 1:
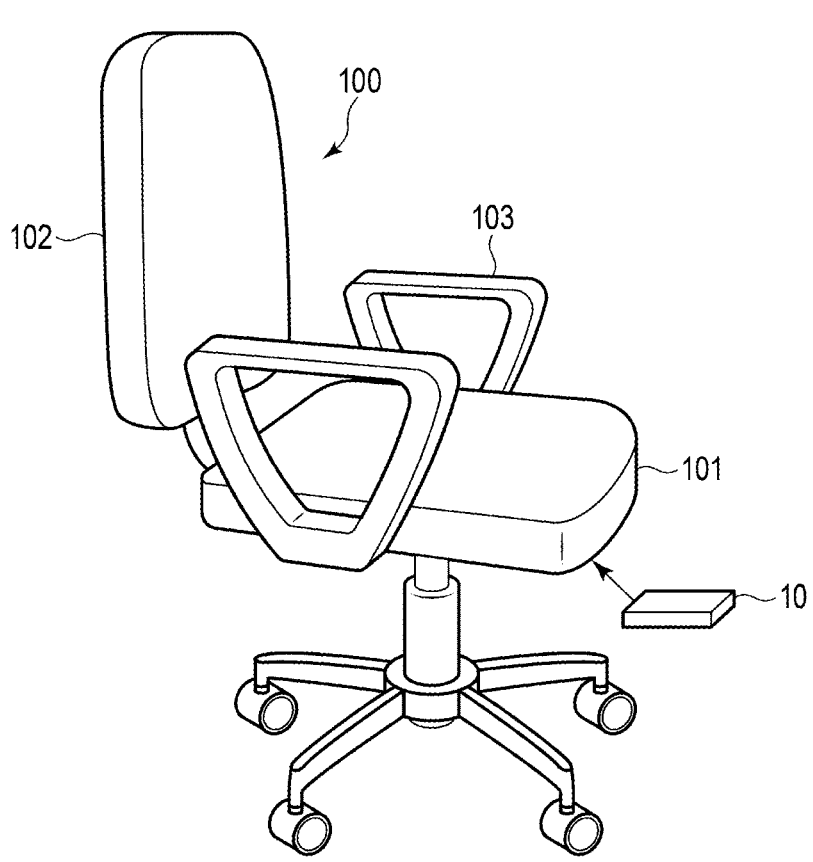
FIG. 1 is a schematic diagram showing an example of attachment of a seating detection device according to an embodiment to a chair.

Hereinafter, an embodiment will be described with reference to the drawings. As shown in FIG. 1, a seating detection device 10 according to the embodiment can be used by being attached to, for example, a back of a seat portion 101 of a chair 100. Alternatively, the seating detection device 10 can also be used by being attached to a backrest 102, an armrest 103, or the like of the chair 100.

In order to improve usability of the chair 100, it is desirable that the seating detection device 10 is attached to a place where a person who sits on the chair 100 (hereinafter, collectively referred to as a user) does not directly touch the seating detection device 10. In any case, the seating detection device 10 may be attached to a position where the user who sits on the chair 100 enters an electric field formed by the seating detection device 10.

It is desirable that the seating detection device 10 is attached in an orientation in which an electrode of a to-be-described sensor substrate 14 (shown for example in FIG. 2) of the seating detection device 10 is disposed in a direction orthogonal to a direction in which the user approaches the chair 100. For example, since the user sits on the seat portion 101 of the chair 100 by moving from an upper side to a lower side, the seating detection device 10 attached to the back of the seat portion 101 is attached in a substantially horizontal posture in which the sensor substrate 14 is along the seat portion 101.

Since the seating detection device 10 according to the embodiment can set by itself a threshold Sb (e.g., an operating threshold or seating threshold) of an electrostatic capacitance that is a reference for determining presence or absence of seating as to be described later, the seating detection device 10 can be used by being attached to any of existing chairs of different types.

Figure 2:
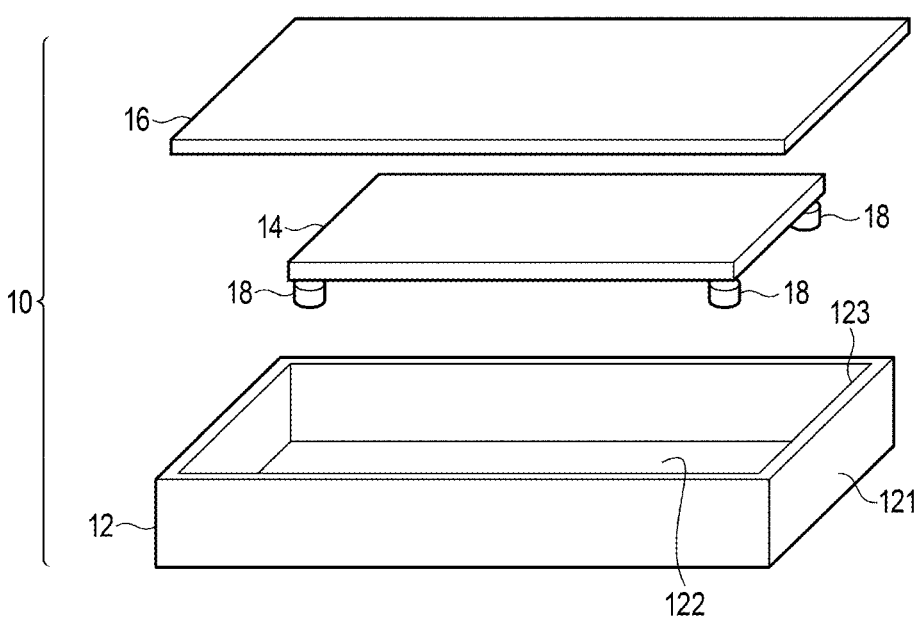
FIG. 2 is an exploded perspective view of the seating detection device.

As shown in FIG. 2, the seating detection device 10 includes a case 12 (e.g., a housing), the sensor substrate 14, and an adhesive sheet 16. The adhesive sheet 16 functions as a fixing part (e.g., a coupler) described in the claims.

The case 12 integrally includes a rectangular frame-shaped peripheral portion 121, and a rectangular plate-shaped bottom portion 122 that closes one end of the peripheral portion 121 in an axial direction (e.g., a downward direction as shown in FIG. 2). The case 12 includes a rectangular opening 123 at the other end of the peripheral portion 121 in the axial direction. The case 12 houses the rectangular plate-shaped sensor substrate 14 in a recess surrounded by the peripheral portion 121 and the bottom portion 122. The recess has a size slightly larger than that of the sensor substrate 14 in the embodiment, but may have the same size as that of the sensor substrate 14. The seating detection device 10 includes four insulating spacers 18 between an inner surface of the bottom portion 122 and the sensor substrate 14.

The case 12 is formed of a conductor in order to block a change in a capacitance from an outside for the electrode of the sensor substrate 14. However, the case 12 does not necessarily have to be formed of a conductor, and is not an essential configuration for the exemplary embodiment. The electrode of the sensor substrate 14 may be a printing pattern formed by a conductor on a substrate surface or the like. The sensor substrate 14 may be a flexible printed circuit board (FPC) or the like, and the electrode may be an electrode printed on the FPC or the like. Due to the spaces 18, a gap is formed between both the case 12 and the sensor substrate 14 in order to electrically separate (e.g., isolate) the case 12 and the sensor substrate 14. The sensor substrate 14 is disposed in the recess of the case 12 in a posture in which the electrode faces an outside (e.g., toward the opening 123 side).

The adhesive sheet 16 is disposed at a position to close the opening 123 of the case 12 in a state of being in contact with the electrode of the sensor substrate 14 disposed in the recess of the case 12. The adhesive sheet 16 is, for example, a dielectric such as acrylic rubber. The adhesive sheet 16 may be, for example, an elastically deformable resin sheet having stretchability and adhesiveness, or may be a double-sided tape whose material itself has an adhesion function. The sensor substrate 14 may be fixed to the chair 100 by using a screw or an adhesive instead of the adhesive sheet 16.

Figure 3:
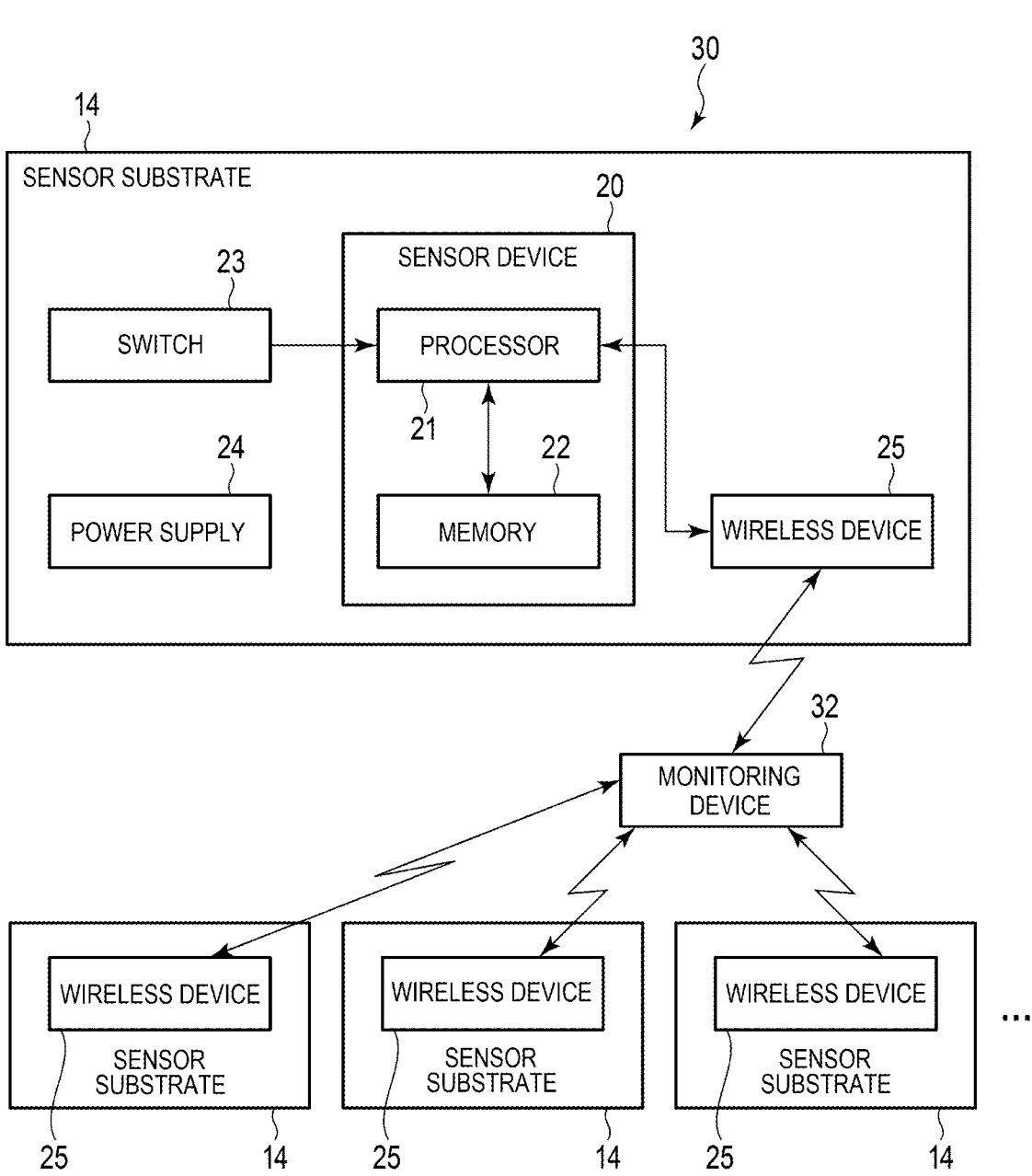
FIG. 3 is a block diagram of a seating monitoring system in which a sensor substrate is wirelessly connected to a monitoring device.

As shown in FIG. 3, the sensor substrate 14 includes a sensor device 20 (e.g., a sensor and controller), a switch 23, a power supply 24, and a wireless device 25. The sensor device 20 functions as a detection unit (e.g., a detector or sensor) described in the claims and also functions as a determination unit (e.g., a controller) described in the claims.

The sensor device 20 includes a processor 21 and a memory 22. The processor 21 executes an arithmetic process. The processor 21 performs various processes based on, for example, a program stored in the memory 22 and data used in the program. The memory 22 stores the program, the data used in the program, and the like.

The sensor device 20 uses power (e.g., electrical energy) supplied from the power supply 24 to form an electric field via the electrode (not shown) of the sensor substrate 14, and detect a change in an electrostatic capacitance when the user of the chair 100 approaches. The detection method for the electrostatic capacitance may be a self-capacitance method or a mutual capacitance method. When an electrostatic capacitance having a value exceeding the threshold Sb stored in the memory 22 is detected, the sensor device 20 determines that the user sits on the chair 100.

The switch 23 can be operated from an outside of the case 12, and the case 12 includes a hole (not shown) for an operation unit (not shown) of the switch 23 to protrude toward the outside of the case 12. The switch 23 connects and cuts off (e.g., switches on or off) a power transmission path for supplying the power (e.g., controls the transmission of the power) from the power supply 24 to the sensor device 20.

The wireless device 25 wirelessly communicates with a monitoring device 32 (e.g., a monitor) of a seating monitoring system 30, and transmits and receives various kinds of data. The wireless device 25 is based on a wireless communication standard such as Wi-Fi, Bluetooth (registered trademark), or EnOcean. The wireless device 25 transmits a determination result of the sensor device 20 to the monitoring device 32.

The monitoring device 32 can wirelessly communicate with the wireless devices 25 mounted on the sensor substrates 14 of a plurality of seating detection devices 10. The monitoring device 32 includes a display unit (not shown) that displays data received from the seating detection devices 10. The monitoring device 32 receives determination results related to the presence or absence of the seating from the plurality of seating detection devices 10.

For example, when the seating monitoring system 30 is used in a cinema or a theater, the monitoring device 32 can display positions of seats and vacant seats in which no person is seated among all audience seats. Therefore, an operator of the monitoring device 32 can determine that a person sits on a seat that is not sold or the like.

Figure 5:
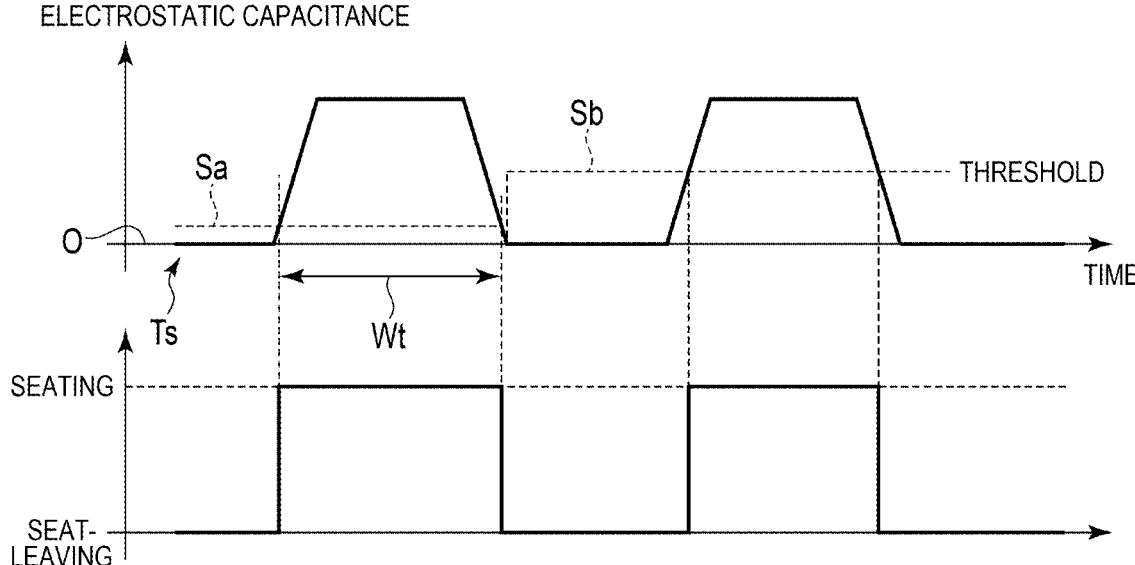
FIG. 5 is a diagram showing an example of a temporal change in an electrostatic capacitance detected by a sensor device.

Hereinafter, an example of a method for using the seating detection device 10 will be described with reference to FIG. 5 together with a flowchart of FIG. 4. When the use of the seating detection device 10 is started, the user first attaches the seating detection device 10 to the back of the seat portion 101 of the chair 100 to be detected. At this time, the seating detection device 10 is adhered by bringing the adhesive sheet 16 into contact with the back of the seat portion 101 of the chair 100. The position where the seating detection device 10 is fixed to the chair 100 is not limited to the back of the seat portion 101, and the seating detection device 10 may be fixed to the backrest 102 or the armrest 103.

After the seating detection device 10 is fixed to the chair 100, the user turns on the switch 23 of the seating detection device 10. At this time, a case where the user turns on the switch 23 in a state of sitting on the chair 100, and a case where the user turns on the switch 23 in a state of not sitting on the chair are assumed. Here, first, the case where the user turns on the switch 23 of the seating detection device 10 in a state of not sitting on the chair 100 will be described.

When the user turns on the switch 23, the processor 21 of the sensor device 20 determines that the switch 23 is turned on in ACT 1 of FIG. 4 (YES in ACT 1). When the switch 23 is turned on, the processor 21 supplies the power from the power supply 24 to the sensor substrate 14, and forms the electric field via the electrode of the sensor substrate 14.

In the state, the processor 21 starts to detect the electrostatic capacitance in ACT 2. The processor 21 stores the electrostatic capacitance detected in ACT 2 into the memory 22. As described above, the electrostatic capacitance detected by the processor 21 changes depending on the presence or absence of the seating of the user. FIG. 5 shows an example of a temporal change in the electrostatic capacitance stored in the memory 22.

The electrostatic capacitance detected by the processor 21 of the sensor device 20 increases as the dielectric approaches the sensor substrate 14. Therefore, when the user sits on the chair 100, a part of a body of the user enters the electric field formed by the electrode of the sensor substrate 14, and the electrostatic capacitance rapidly increases. The change in the electrostatic capacitance shown in FIG. 5 represents the presence or absence of the seating of the user, and indicates that the user is seated in a time zone where the electrostatic capacitance increases.

Since the user does not sit on the chair 100 at a time point Ts at which the processor 21 starts to detect the electrostatic capacitance in ACT 2, an initial value of the electrostatic capacitance detected by the processor 21 in ACT 2 is an offset capacitance O when the user does not sit on the chair 100. The offset capacitance O is a value determined according to a thickness or a material of the seat portion 101 of the chair 100, a shape of the electrode of the seating detection device 10, a shape or a layout of a surrounding component such as the case 12, a surrounding environment such as a temperature, and the like. The offset capacitance O is a value of the electrostatic capacitance detected by the processor 21 at a time point at which the user turns on the switch 23. When an electrostatic capacitance lower than the offset capacitance O is detected, the processor 21 updates the offset capacitance O to the smaller value.

After the detection of the electrostatic capacitance is started in ACT 2, the processor 21 sets a temporary threshold Sa for setting the threshold Sb of the electrostatic capacitance that is a seating determination reference in ACT 3. The temporary threshold Sa is smaller than the threshold Sb used in a seating monitoring mode to be described later. The temporary threshold Sa is desirably set to a value slightly larger than the offset capacitance O in order to detect experimental seating of the user for setting the threshold Sb with sensitivity higher than usual. For example, the processor 21 sets a value obtained by adding a predetermined fixed value to the offset capacitance O as the temporary threshold Sa, and stores the value into the memory 22 in ACT 3.

After the temporary threshold Sa is set in ACT 3, the processor 21 waits for the experimental seating performed by the user, and determines whether the electrostatic capacitance detected by the sensor device 20 exceeds the temporary threshold Sa in ACT 4. In order to set the threshold Sb, the user needs to perform the seating and seat-leaving once. When it is determined in ACT 4 that there is the experimental seating performed by the user (YES in ACT 4), the processor 21 integrates a value, which is obtained by subtracting the offset capacitance O from the electrostatic capacitance detected by the sensor device 20, in a time zone Wt in which the electrostatic capacitance exceeds the temporary threshold Sa, and calculates an average value of the electrostatic capacitances in ACT 5.

After the average value of the electrostatic capacitances is calculated in ACT 5, the processor 21 sets the appropriate threshold Sb derived from the average value in ACT 6. In the embodiment, in ACT 6, 60% of the average value is set as the threshold Sb. The appropriate threshold Sb referred to here is a value determined mainly depending on the electrode shape of the sensor substrate 14. An appropriate value of a ratio to the average value differs depending on a type of the sensor substrate 14. Therefore, the threshold Sb is desirably set to, for example, 30% to 70% of the average value calculated in ACT 5.

The processor 21 stores the threshold Sb set in ACT 6 into the memory 22 to replace the threshold Sa. Further, the processor 21 transmits the threshold Sb set in ACT 6 to the monitoring device 32 via the wireless device 25.

After the threshold Sb is set in ACT 6, the processor 21 shifts to the seating monitoring mode using the threshold Sb, and determines whether the electrostatic capacitance detected by the sensor device 20 exceeds the threshold Sb in ACT 7. When determining that the electrostatic capacitance exceeds the threshold Sb in ACT 7 (YES in ACT 7), the processor 21 determines that the user is seated in the chair 100 (ACT 8). When determining that the electrostatic capacitance does not exceed the threshold Sb in ACT 7 (NO in ACT 7), the processor 21 determines that the user is not seated in the chair 100 (ACT 9). The processor 21 transmits the determination result in ACT 8 or the determination result in ACT 9 to the monitoring device 32 (ACT 10).

After the determination result of the seating is transmitted to the monitoring device 32 in ACT 10, the processor 21 shifts to a power-saving mode in ACT 11. In the power-saving mode, the processor 21 cuts off the supply of the power from the power supply 24 for a certain period of time (for example, from several seconds to several tens of seconds). In other words, when determining that the switch 23 is not turned off (NO in ACT 12) and a certain period of time elapses (YES in ACT 13) after the mode is shifted to the power-saving mode, the processor 21 shifts to ACT 7 and cancels the power-saving mode.

Incidentally, if the switch 23 is turned on in a state where the user sits on the chair 100 when the use of the seating detection device 10 described above is started, the processor 21 of the sensor device 20 temporarily stores the electrostatic capacitance detected in the state where the user is seated in the chair 100 into the memory 22 as the offset capacitance O. In this case, thereafter, since when the user leaves the seat, the detected electrostatic capacitance reduces, and at the time point, the processor 21 overwrites a value of the reduced electrostatic capacitance into the memory 22 as the new offset capacitance O. Thereafter, the processor 21 shifts to ACT 3, and continues the process based on the updated offset capacitance O.

As described above, according to the embodiment, the threshold Sb suitable for the chair 100 can be set by attaching the seating detection device 10 to the chair 100 subjected to the seating detection and turning on the switch 23. Therefore, in the seating detection device 10 according to the embodiment, the detection sensitivity can be optimized according to characteristics of the chair 100 to be attached to, and the seating detection device 10 can be used by being attached to existing chairs of different materials or structures.

The seating detection device 10 described above may include an LED lamp or the like to be turned on from when the switch 23 is turned on to when the setting of the threshold Sb is ended in ACT 6. For example, the LED lamp may be used such that the LED lamp is turned on during detection of the "seating" in which the user sits on the chair 100 and turned off due to the "seat-leaving".

Figure 6:
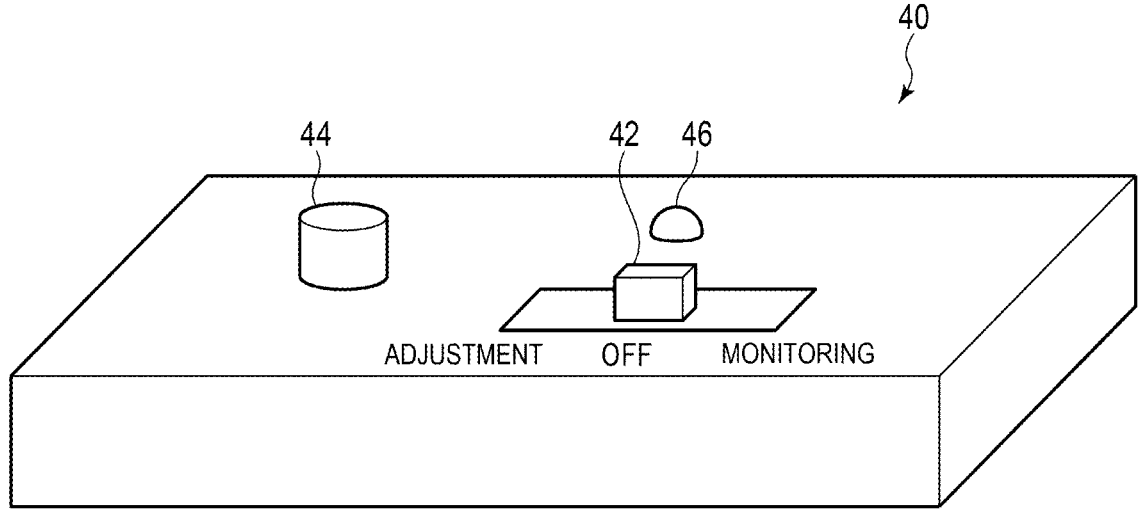
FIG. 6 is an external perspective view showing a modification of the seating detection device.

FIG. 6 is an external perspective view showing a modification of the seating detection device 10 described above. A seating detection device 40 according to the modification includes a mode switching switch 42 instead of the switch 23. Further, the seating detection device 40 includes a user interface that includes a sensitivity adjustment knob 44 (e.g., an input device, a user input interface) that adjusts the threshold and an LED lamp 46 (e.g., an output device, a notifier, an indicator, a visual indicator). Since other configurations are substantially the same as those of the seating detection device 10 described above, description related to configurations that similarly function will be omitted.

The mode switching switch 42 can be switched to any one of a position for selecting an adjustment mode for adjusting the threshold of the seating detection, a position for selecting the seating monitoring mode, and an off position for cutting off a power supply.

In the seating detection device 40 according to the modification, when the threshold Sb described above for detecting presence or absence of the seating is set, the user switches the mode switching switch 42 from the off position to the adjustment mode position after the seating detection device 40 is attached to the chair 100. When the mode switching switch 42 is switched to the adjustment mode position, the processor 21 of the sensor device 20 refers to a value of the sensitivity adjustment knob 44, and sets the value as the threshold Sb. The processor 21 forms an electric field via an electrode of the sensor substrate 14, and detects an electrostatic capacitance.

In the state, the user repeatedly seats in and leaves the chair 100. When the electrostatic capacitance exceeds the threshold Sb, the processor 21 determines the "seating" and turns on the LED lamp 46. When the electrostatic capacitance is less than the threshold Sb, the processor 21 determines the "seat-leaving" and turns off the LED lamp 46.

The user repeats the seating and the seat-leaving while viewing the LED lamp 46, whereby the user determines whether the seating detection device 40 can normally determine the "seating" and the "seat-leaving", and operates the sensitivity adjustment knob 44 to adjust the threshold Sb to an appropriate value.

After the threshold Sb is adjusted, the user switches the mode switching switch 42 from the adjustment mode position to a seating monitoring mode position. Thereafter, the processor 21 determines the "seating" and the "seat-leaving" based on the threshold Sb adjusted to the appropriate value by the sensitivity adjustment knob 44, and transmits the determination result to the monitoring device 32 of the seating monitoring system 30.

As described above, according to the seating detection device 40 of the modification, the sensitivity adjustment knob 44 can be operated to adjust the threshold Sb, and the detection sensitivity of the seating can be set to any value. Therefore, the seating detection device 40 according to the modification can also achieve effects similar to those of the seating detection device 10 described above. That is, in the modification, the detection sensitivity of the "seating" can also be optimized according to the characteristics of the chair 100 to be attached to, and the seating detection device 40 can be used by being attached to existing chairs of different materials or structures. Further, according to the seating detection device 40 of the modification, even if the sensitivity differs depending on a physique, an age, or the like of the user who sits on the chair 100, since the threshold Sb can be finely adjusted, more accurate "seating" detection can be performed.

Although certain exemplary embodiments are described, these embodiments are presented as examples only, and are not intended to limit the scope of the exemplary embodiments. These novel embodiments can be implemented in various other forms, and various omissions, substitutions, and changes can be made without departing from the spirit of the exemplary embodiments. The accompanying claims and their equivalents are intended to cover such forms or modifications as would fall within the scope and spirit of the exemplary embodiments.

What is claimed is:

1. A seating detection device comprising:
   a sensor configured to form an electric field to detect a change in electrostatic capacitance;
   a coupler configured to couple the sensor to a chair;
   a power supply configured to supply power for forming the electric field to the sensor;
   a switch configured to control transmission of the power from the power supply to the sensor; and
   a controller configured to:
      set, based on an electrostatic capacitance detected by the sensor in an unoccupied state where an occupant is not seated on the chair, a temporary threshold that is larger than the electrostatic capacitance detected by the sensor in the unoccupied state;
      receive a plurality of electrostatic capacitances detected by the sensor during an experimental seating period;
      calculate an average value of the electrostatic capacitances that both (a) were detected by the sensor during the experimental seating period and (b) exceeded the temporary threshold;
      after the switch is turned on, set a seating threshold based on the average value, the seating threshold representing a threshold amount of electrostatic capacitance; and determine whether an occupant is seated on the chair based on the seating threshold.

2. The seating detection device of claim 1, wherein the controller is configured to determine whether the occupant is seated in the chair by comparing an electrostatic capacitance detected by the sensor after setting the seating threshold to the seating threshold.

3. The seating detection device of claim 2, wherein the controller is configured to determine that the occupant is seated in the chair in response to the electrostatic capacitance detected by the sensor after setting the seating threshold exceeding the seating threshold.

4. The seating detection device of claim 1, wherein the controller is configured to adjust the temporary threshold in response to the sensor detecting an electrostatic capacitance that is less than the electrostatic capacitance detected by the sensor in the unoccupied state.

5. The seating detection device of claim 1, wherein the controller is configured to decrease the temporary threshold in response to the sensor detecting an electrostatic capacitance that is less than the electrostatic capacitance detected by the sensor in the unoccupied state.

6. The seating detection device of claim 1, further comprising a housing defining a recess that receives the sensor, wherein the housing is formed from a conductor.

7. A seating detection device comprising:
   a sensor configured to form an electric field to detect an electrostatic capacitance;
   a coupler configured to couple the sensor to a chair;
   a power supply configured to supply power for forming the electric field to the sensor;
   a user interface; and
   a controller configured to:
      adjust a seating threshold in response to receiving a user input through the user interface, the seating threshold representing a threshold amount of electrostatic capacitance; and
      determine whether an occupant is seated on the chair based on the seating threshold and the electrostatic capacitance detected by the sensor,
   wherein the controller is reconfigurable between (a) an adjustment mode in which the controller is configured to adjust the seating threshold in response to receiving the user input through the user interface and (b) a monitoring mode in which the controller does not adjust the seating threshold in response to receiving the user input through the user interface.

8. The seating detection device of claim 7, wherein the controller is configured to determine whether the occupant is seated in the chair by comparing the electrostatic capacitance detected by the sensor to the seating threshold.

9. The seating detection device of claim 8, wherein the controller is configured to determine that the occupant is seated in the chair in response to the electrostatic capacitance detected by the sensor exceeding the seating threshold.

10. The seating detection device of claim 7, wherein:
    the user interface includes a switch that is repositionable between a first position and a second position;
    the controller is configured to enter the adjustment mode in response to the switch entering the first position; and
    the controller is configured to enter the monitoring mode in response to the switch entering the second position.

11. The seating detection device of claim 7, wherein:
    the user interface includes a knob;
    the controller is configured to increase the seating threshold in response to a rotation of the knob in a first direction; and the controller is configured to decrease the seating threshold in response to a rotation of the knob in a second direction opposite the first direction.

12. The seating detection device of claim 7, wherein:

the user interface includes an indicator; and the controller is configured to activate the indicator in response to a determination that the occupant is seated on the chair.

13. A seating monitoring system comprising:

a seating detection device comprising:

a user interface;

a sensor configured to form an electric field to detect an electrostatic capacitance;

a coupler configured to couple the sensor to a chair;

a power supply configured to supply power for forming the electric field to the sensor; and a controller configured to:

determine whether an occupant is seated on the chair by comparing the electrostatic capacitance detected by the sensor with a seating threshold; and adjust the seating threshold in response to receiving a user input through the user interface; and a monitor configured to receive and display a determination result of the controller.

14. The seating monitoring system of claim 13, wherein the controller is configured to set the seating threshold based on a change in electrostatic capacitance detected by the sensor.

15. The seating monitoring system of claim 14, wherein the controller is configured to:

set, based on an electrostatic capacitance detected by the sensor in an unoccupied state where the occupant is not seated on the chair, a temporary threshold that is larger than the electrostatic capacitance detected by the sensor in the unoccupied state;

receive a plurality of electrostatic capacitances detected by the sensor during an experimental seating period;

calculate an average value of the electrostatic capacitances that both (a) were detected by the sensor during the experimental seating period and (b) exceeded the temporary threshold; and set the seating threshold based on the average value.

16. The seating monitoring system of claim 13, wherein:

the seating detection device is a first seating detection device and the chair is a first chair; and the seating monitoring system further comprises a second seating detection device configured to be coupled to a second chair and operatively coupled to the monitor.

17. The seating monitoring system of claim 13, wherein the monitor is configured to indicate whether a payment has been received for use of the chair.

* * * * *